(12) United States Patent
Simunic et al.

(10) Patent No.: US 6,197,605 B1
(45) Date of Patent: Mar. 6, 2001

(54) METHOD AND DEVICE FOR TEST VECTOR ANALYSIS

(75) Inventors: Tajana Simunic, Sunnyvale; Naresh U. Mehta, Santa Clara; Caleb Crome, Mt. View, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/321,070

(22) Filed: May 27, 1999

Related U.S. Application Data

(63) Continuation of application No. 08/729,254, filed on Oct. 9, 1996, now Pat. No. 5,923,567.
(60) Provisional application No. 60/015,126, filed on Apr. 10, 1996.

(51) Int. Cl.$^7$ ..................................... H01L 21/66
(52) U.S. Cl. ................. 438/14; 438/17; 438/18
(58) Field of Search .................. 638/10–18; 703/13, 703/23; 714/30, 33; 716/2

(56) References Cited

U.S. PATENT DOCUMENTS

| | | |
|---|---|---|
| 4,862,399 | 8/1989 | Freeman . |
| 4,878,179 | 10/1989 | Larsen et al. . |
| 4,996,659 | 2/1991 | Yamaguchi et al. . |
| 5,325,309 | 6/1994 | Halaviati et al. . |
| 5,539,652 | 7/1996 | Tegethoff . |
| 5,574,853 * | 11/1996 | Barch et al. ............................ 714/30 |
| 5,625,580 | 4/1997 | Read et al. . |
| 5,642,504 | 6/1997 | Shiga . |
| 5,661,662 | 8/1997 | Butts et al. . |
| 5,717,928 | 2/1998 | Campmas et al. . |
| 5,815,513 | 9/1998 | Hiraide . |
| 5,923,567 * | 7/1999 | Simunic et al. ......................... 716/2 |

* cited by examiner

*Primary Examiner*—Kevin M. Picardat
(74) *Attorney, Agent, or Firm*—Townsend and Townsend and Crew LLP

(57) ABSTRACT

A method and device for testing and manufacturing integrated circuits such as microprocessors, memories, ASICs, programmable logic, and other types of integrated circuits. A test system is designed to test the relevant integrated circuit. A device under test emulator responds to the test system. If modifications are needed, the test system can be modified, and used to test actual devices.

36 Claims, 4 Drawing Sheets

METHOD AND DEVICE FOR TEST VECTOR ANALYSIS

This application is a continuation of U.S. patent application Ser. No. 08/729,254, filed Oct. 9, 1996, now U.S. Pat. No. 5,923,567, which claims priority from U.S. provisional patent application No. 60/015,126, filed Apr. 10, 1996, the entire disclosures of which are incorporated by reference for all purposes.

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

MICROFICHE APPENDIX

A microfiche appendix including 60 frames on one fiche is included herewith.

BACKGROUND OF THE INVENTION

The present invention relates to the field of integrated circuits, their manufacture, design, and operation. More specifically, in one embodiment the invention provides an improved method and device for testing integrated circuits in which the test system is qualified without the presence of an integrated circuit device.

Integrated circuit test systems are well known to those of skill in the art and are widely utilized in the integrated circuit manufacturing process. In a typical manufacturing process integrated circuit devices are formed on a wafer. A first test step is used to test the devices after fabrication on the wafer. The wafer is then diced and the individual integrated circuits are placed in packages. A second test step is then performed to test the fully packaged devices.

In a typical test system carefully selected signals are applied to the wafer probe leads or to the package leads of the device under test (DUT), and the response of the integrated circuit to these signals is monitored. The signals applied to the leads are referred to as "vectors" or "test vectors."

As integrated circuits are improved it is necessary to formulate new test vectors to apply to the improved integrated circuits. For example, as a microprocessor moves from one generation to another, it typically will increase in complexity. Accordingly, it is necessary to develop new test vectors and software for monitoring the response to the test vectors for each generation of microprocessors.

The conventional processes, however, are not desirable. As recognized herein, conventional processes result in long lead times for integrated circuit design and manufacturing. Specifically, the invention herein recognizes that it is extremely inefficient to wait for the first device to be manufactured before the test vectors for a test system may be utilized or tested. Since the test vectors often do not correctly or fully test the device, it is necessary after the first devices are fabricated to modify the test vectors. This leads to longer cycle times for developing and manufacturing integrated circuits.

From the above it is seen that an improved method of manufacturing integrated circuits is needed.

SUMMARY OF THE INVENTION

An improved method and set of devices for manufacturing integrated circuits is disclosed by virtue of the present invention. A software model of a device under test is placed on an appropriately programmed digital computer. A semiconductor test system (for example a wafer prober) is programmed to perform an appropriate test operation on the device under test. A software model of the device under test is used to test the test system software components and test vectors. Since these operations may be completed even before the first device is actually fabricated, the cycle time for new integrated circuit products may be reduced, and the efficiency of test operations may be improved.

Accordingly, in one embodiment the invention provides a method of making integrated circuits comprising the steps of designing an integrated circuit; developing a test process for the integrated circuit; simulating a response of the integrated circuit to the test process; modifying the test process in response to the step of simulating a response of the integrated circuit; fabricating an actual integrated circuit; and using the modified test process to test the actual integrated circuit.

A further understanding of the nature and advantages of the inventions herein may be realized by reference to the remaining portions of the specification and the attached drawings.

DESCRIPTION OF THE PREFERRED EMBODIMENTS

Figure 1:
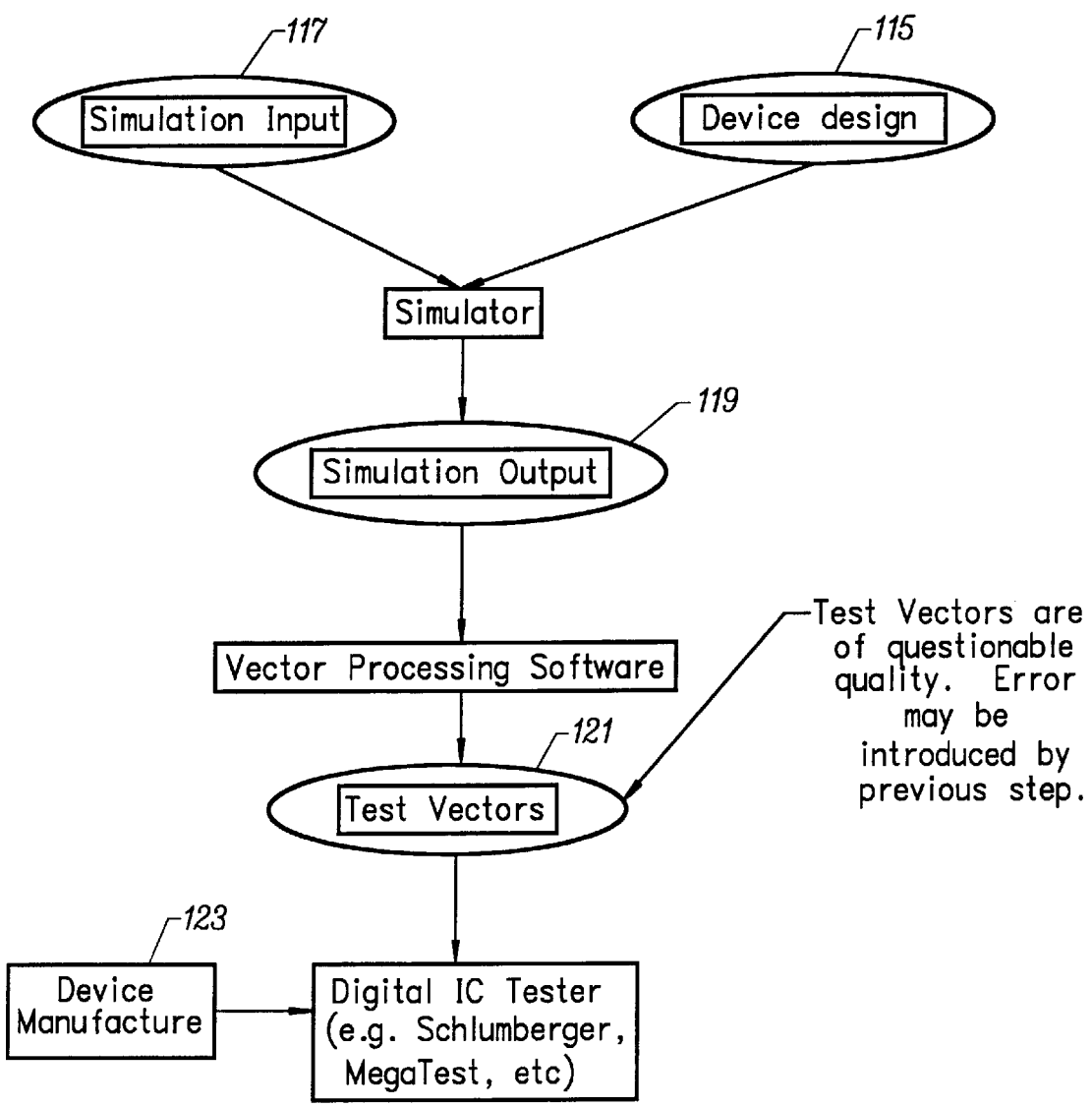
FIG. 1 is an overall flow diagram illustrating a conventional prior art integrated circuit design and manufacturing operation.

FIG. 1 illustrates in block diagram form a prior art manufacturing process. The device design 115 is described by the netlist. It is used together with simulation input 117 for the simulator to test the device design and provide simulation output 119. The simulator in this case tests only the design, not the test system. This loop is repeated until device design is finished and checked through simulation. Vector processing software then takes the simulation output and generates test vectors 125 which are to be input into a digital IC tester. When the device first comes from manufacturing 123, the digital IC tester is used to determine if the device operates correctly. At this point debugging is needed because one does not know if the device design was correct to begin with, if the correct test vectors were used, if the vector processing software worked, if the hardware is interacting with software correctly, etc. As a result, time is wasted and often more manufacturing/redesign steps are needed to ready the device for mass production.

According to the present invention, the design of the chip (as described by the netlist) and the test system (test vectors, software and hardware) go in parallel and are checked concurrently, so time is saved and problems are ironed out before the device goes into manufacturing. In addition, both design engineers and test engineers use the same design description and the same simulator to check both the device design and the test system design. Simulation output gives immediate feedback to engineers as to the correctness of the designs. For engineers who design test vectors, the interface preferably looks the same as the interface to the digital IC tester does, so when they design the test system they are designing what will actually be used to test real parts when in mass production. The IC is manufactured after the simulation outputs are correct and the layout is completed. When the part comes back from manufacturing, instead of directing test vectors to the simulator, the test vectors go straight into the digital IC tester the same way as they would to the simulator.

The invention allows the development of test vectors to be performed in parallel with the design of the IC. Also, the connection of the test vendors system to the simulator vendors system allows comprehensive simulation of the test program in parallel with the development of the IC. Accordingly, the system reduces development time for test programs and ICs, uses the same test tools that will be used in manufacturing to be used through the entire development process. Prior to generating an expensive set of masks, the design and test programs have been thoroughly debugged. Thus, fewer iterations of test programs and IC mask sets are required to achieve a manufacturable product. The concepts herein are applied in the context of digital devices such as programmable logic devices, but the concepts can be extended to encompass analog simulation, test coverage simulation or other types of simulation required to ensure the integrity of the IC manufacturing process. The tested semiconductor devices may be selected from any of a wide variety of semiconductor devices including, but not limited to, microprocessors, memories, ASICS, programmable logic devices, and others.

Figure 2A:
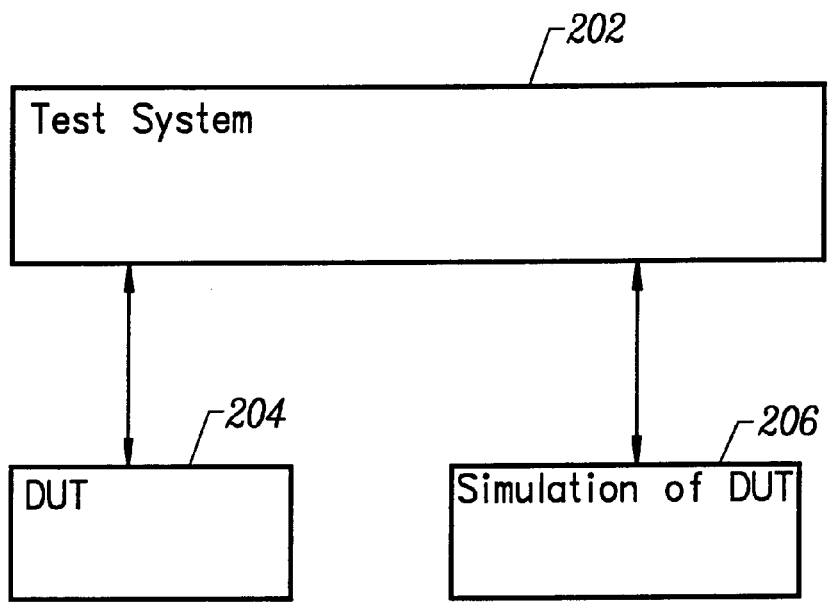
FIGS. 2A and 2B illustrate an overall block diagram of a semiconductor test system according to the present invention.

FIG. 2A illustrates the overall architecture of the test system herein. The test system 202 is designed to interact in the same manner with an actual device under test 204 or a simulated device under test 206. In cases where the test system is located on a different computer from the simulated DUT, the communication between the computers may be via, for example, an ethernet link. Preferably, the test system switches from one system to another transparently based only upon the changing of a simple software switch. The simulation of a device under test may be performed without any actual interface to a device tester, in which case the interaction is purely through data exchange from one software system to another or one computer system to another, resulting in decreased development costs. In another embodiment the actual tester interfaces with a device simulator to provide input to the test system.

By using an appropriate software extension of the actual simulator, the same input can be applied to the software embodiment (simulated) of the DUT as is used to interface with the actual DUT in the tester. During the development cycle of the integrated circuit, the output of the simulated DUT is compared to the expected response to a test vector or test vectors. In cases where a difference exists between the expected response of the device and the response of the simulated DUT, an engineer may have access to the internal states of the simulated DUT, allowing for more readily identified errors. In those cases where the expected device response does not match the simulated DUT response, changes can then quickly be made to either the IC design, or to the test vectors. By repeating this cycle the designers can ensure that the test design and the device design are reconciled, before the device is actually fabricated. Once the device is actually fabricated, the test system is switched to provide input to the actual test system. Optionally, the engineer may continue to direct test vectors to both the simulated DUT and the actual DUT. In this manner, the engineer may more easily locate manufacturing defects in the IC.

Figure 2B:
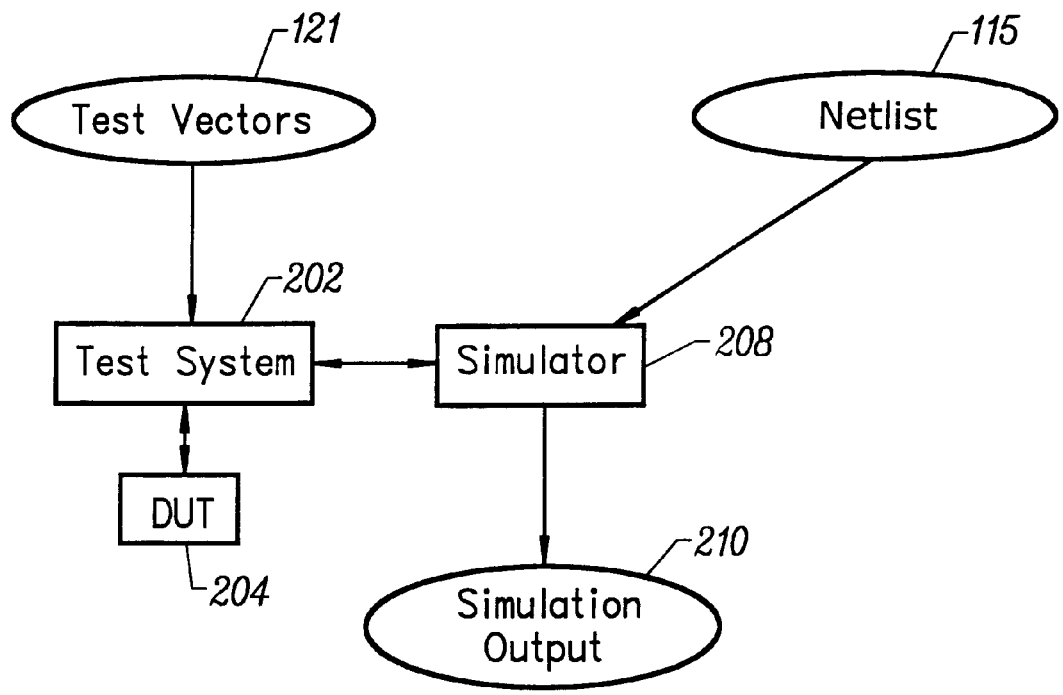

FIG. 2B illustrates additional aspects of the invention. As shown, the test system 202 receives test vectors 121 and supplies such test vectors to the simulator 208 directly or indirectly via the actual tester 204. Simulator 208 may be any one of a variety of, IC device simulators such as those made by ChronoLogic, ViewLogic or cadence. The output 210 is compared with either the expected device output or the actual device input to design/monitor the testing process.

In preferred embodiments the digital IC tester 202 is a conventional tester such as those available from Schlumberger, MegaTest, or others. Of course the concepts herein are also applicable to analog circuits and other systems such as good level testers. The link between the tester and the simulator is, for example, an ethernet or other computer link such as an ATM or token ring system. Accordingly, even different computer architectures may be linked together. Since the test vectors and simulator input are the same, test and design engineers use consistent input, and there is reduced chance of error. Depending on which tester is utilized, the tester may be utilized directly, or a stand-alone computer without any test hardware may be utilized to minimize the development cost of any new test software.

Through use of the system herein, the test vectors and the simulator input are the same. Accordingly, there is no significant possibility of introducing error through additional processing in the conversion that would otherwise be required. Additionally, test engineers work in the same environment regardless of whether they are simulating or testing actual devices.

In this case, design of the chip (as described by the netlist) and the test system (test vectors, software and hardware) go in parallel and are checked concurrently so time is saved and problems are ironed out before the device goes into manufacturing. In addition, both design engineers and test engineers use the same design description and the same simulator to check both the device design and the test system design. Simulation output gives immediate feedback to engineers as to correctness of the design. For engineers who design test vectors, the interface looks the same as the interface to the digital IC tester does so when they design the test system, they are designing what will actually be used to test real parts when in mass production. The device is manufactured after the simulation outputs are correct and the layout is completed. When the part comes back from manufacturing, instead of directing test vectors to the simulator, the test vectors now go into the digital IC tester in the same way as they would to the simulator.

Accordingly, the invention provides a simulation strategy that places the development of test vectors in parallel with the design of the IC, and the connection of the test vendor's system to the simulator vendor's system, which allows comprehensive simulation of the test program in parallel with the development of the IC. The invention reduces development time for test programs and ICs. Also, engineers do not have to learn many different sets of tools to develop a working manufacturing flow; the same test tools that will be used in manufacturing are used through the entire development process. Further, prior to generating an expensive set of masks, the design and test programs have been thoroughly debugged. Thus, fewer iterations of test programs and IC mask sets are required to achieve a manufacturable product. While illustrated with regard to digital integrated circuit applications, this concept can be extended to encompass analog simulation, test coverage simulation, or other types of simulation required to ensure the integrity of the IC manufacturing process.

Figure 3:
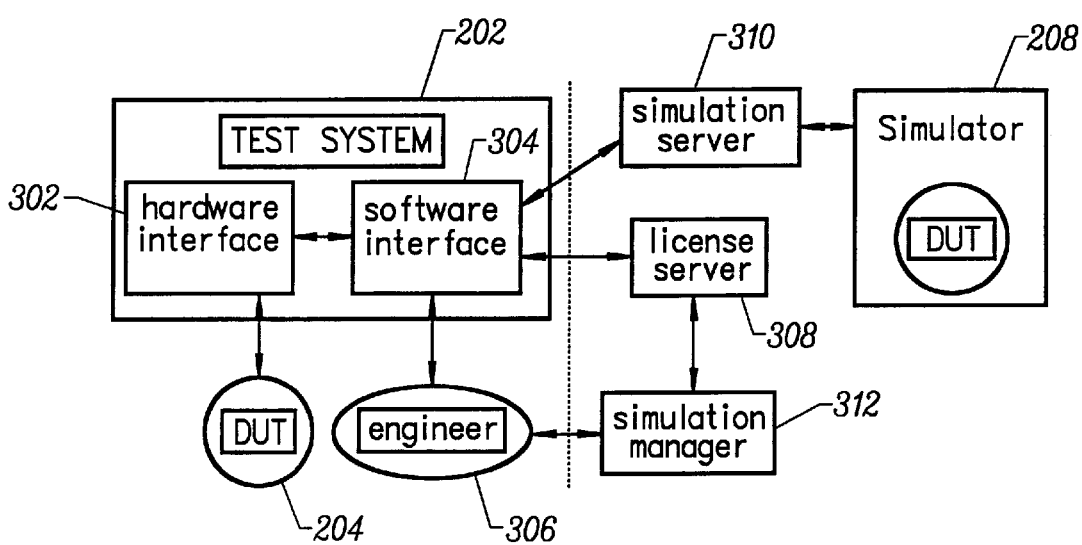
FIG. 3 is an overall block diagram illustrating the architecture of the simulation system.

FIG. 3 illustrates the system in greater detail. As shown the test system 202 includes, inter alia, a hardware interface 302 and a software interface 304 that interface with the testeractual device under test 204 and the simulation engine 208, respectively, as well as each other. An engineer 306 interacts not with the tester 204 but with the test system 202, making it transparent to the engineer whether test vectors are applied to the actual device or to the simulated device. The software interface 304 also interfaces with a license server 308 and the simulation server 310. The simulation server in turn interacts with the simulation engine 208 which includes software built on a simulator such as "vsimxl" made by ViewLogic. All test vectors are sent to the simulator which then applies them to the model of the DUT and returns the pin states back to the test system. A software interface may be used to point to any differences between expected and actual performance, just as when an actual device is under test. Preferably, the test system is built upon the same software as the organization uses in design such that the same databases can be utilized by both groups.

When the simulator is being utilized the software interface interacts with the license server to obtain access to a particular part the engineer wants to test (or, more particularly, the database representing the part the engineer wishes to test). The license server responds by giving the free license number to the software interface, which then connects via the simulation server to the simulator. When a simulation is complete the software interface disconnects from the simulation server and then calls the license server to free the license again.

The simulation manager 312 is used as a user interface to the license server. It allows an engineer to specify information needed to obtain access to the license server to either start simulations for a given design, kill simulation, or list information about the simulations currently loaded at a given computer.

Figure 4:
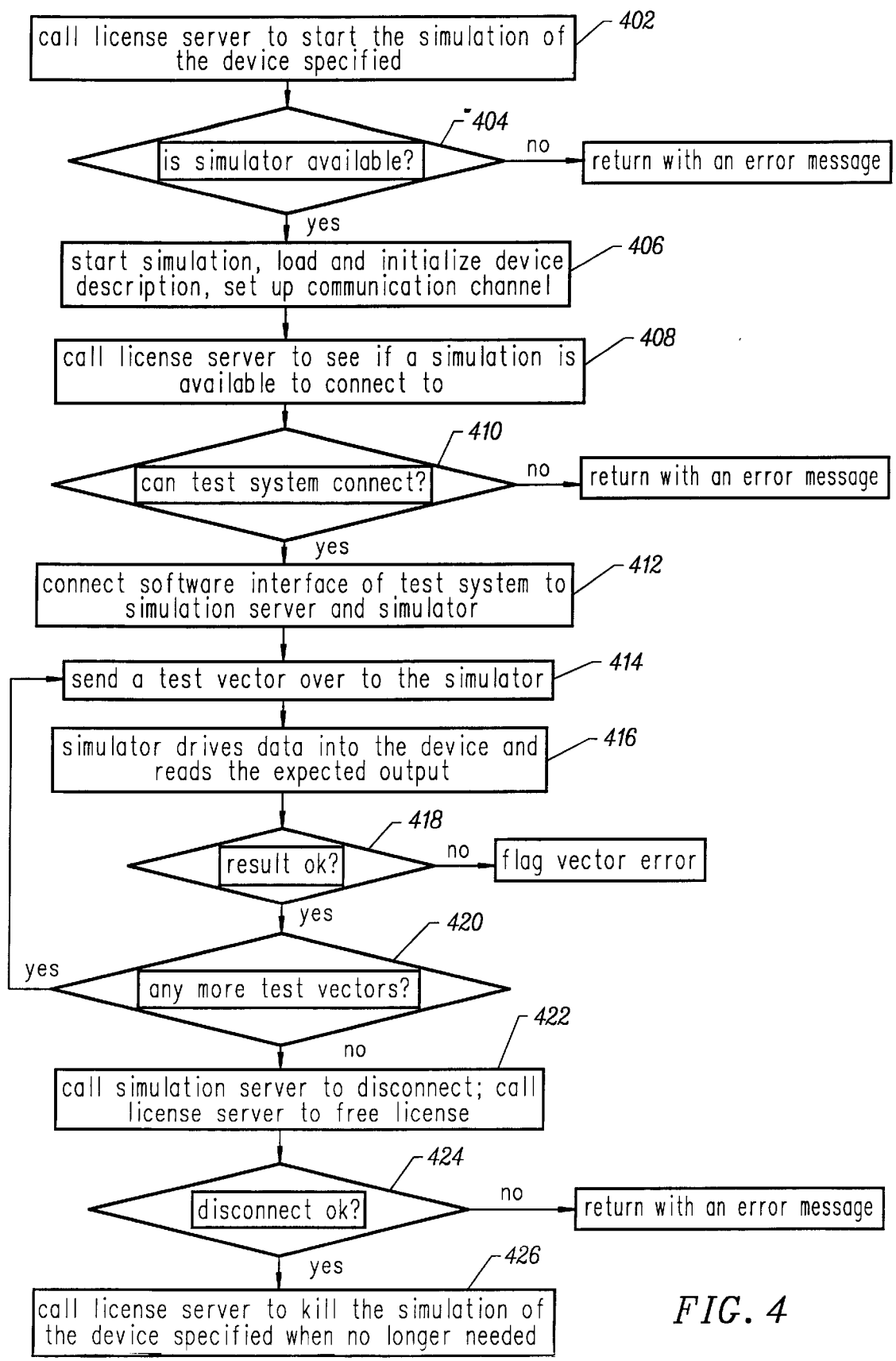
FIG. 4 is a flowchart illustrating operation of the device under test software model.

FIG. 4 illustrates an overall flowchart for the software system used herein. At step 402 the system calls the license server to start the simulation of the device. At step 404 the system determines if the simulator is available. If not, an error message is returned, but if so the simulation of the device is started at step 406. At steps 408 and 410 the system determines if a simulation is available and if the system can connect for a simulation. If so, the software interface of the test system is connected to the simulation server and, therefore, the simulator. At step 414 a test vector is applied to the simulator and at step 416 the simulator drives the data to the device and reads the output. At step 418 it is determined if the device is performing as expected and, if not, an error flag is generated. At step 420 it is determined if more test vectors are to be applied, and the process is repeated until there are no additional test vectors. At step 422 the simulation server is called for a disconnect, and the license is freed. At step 424 it is determined if the disconnect was OK and if not an error is flagged. After disconnect, the license server is called to stop the simulation of the device after it is no longer needed.

After testing the test process with the device simulator, it may be desirable to make modifications to the test process. Merely by way of example, it may be necessary or desirable to modify the test vectors applied to the DUT. After all desired changes have been made to the system, the device simulator may be removed from operation, and the tester may be used to test actual devices 213. It will be recognized that the tester is conceptually illustrated as a wafer prober, but the system herein will also apply to other test environments such as packaged device testing, membrane test systems, and others.

Microfiche Appendix 1 includes source code for implementation of a specific embodiment of the invention. This particular code is to be implement in a Sun workstation or equivalent and designed to receive test vectors from an Altera PC based test system, apply them to the simulator, and return the results of the simulation.

The above description is illustrative and not restrictive. Many variations of the invention will become apparent to those of skill in the art upon review of this disclosure. Merely by way of example the invention has been described with reference to particular simulation systems, but the invention should not be so limited. The scope of the invention should, therefore, be determined not with reference to the above description, but instead should be determined with reference to the appended claims along with their full scope of equivalents.

What is claimed is:

1. A method of developing a test process for testing integrated circuits comprising:

provided a test system;

in the test system, receiving a first test process for an integrated circuit;

in the test system, applying the first test process to a simulated version of the integrated circuit before fabrication of the integrated circuit;

in the test system, receiving a second test process, wherein the second test process is generated from the first test process based on responses received by the test system from applying the first test process to the simulated version of the integrated circuit; and in the test system, applying the second test process to the fabricated integrated circuit.

2. The method of claim 1 wherein the simulation of the integrated circuit is based on design information for the integrated circuit.

3. The method of claim 2 wherein the design information includes netlist information for the integrated circuit.

4. The method of claim 1 further comprising:

in the test system, receiving test responses from applying the second test process to the fabricated integrated circuit.

5. The method of claim 1 wherein the integrated circuit is a programmable logic device.

6. The method of claim 1 wherein the integrated circuit is an analog circuit.

7. A method of developing a test process for testing integrated circuits comprising:

providing a test system;

providing a first test process for an integrated circuit;

in the test system, applying the first test process to a simulation of the integrated circuit before fabrication of the integrated circuit;

modifying the first test process to create a second test process based upon responses received by the test system from applying the first test process to the simulation of the integrated circuit; and in the test system, applying the second test process to a fabricated embodiment of the integrated circuit.

8. The method of claim 7 wherein modifying the first test process to create the second test process comprises:

comparing the responses received by the test system from applying the first test process to the simulation of the integrated circuit to expected responses; and modifying the first test process based on the comparison.

9. The method of claim 7 wherein applying the second test process to the fabricated embodiment of the integrated circuit comprises:

in the test system, generating responses by applying the second test process to the fabricated embodiment of the integrated circuit.

10. The method of claim 7 wherein the integrated circuit is a programmable logic device.

11. A method of developing test parameters for testing an integrated circuit comprising:

providing first test parameters for the integrated circuit to a test system;

in the test system, receiving responses generated by applying the first test parameters to a simulation of the integrated circuit before fabrication of the integrated circuit;

generating second test parameters from the first test parameters based on the responses received by the test system from applying the first test parameters to the simulation of the integrated circuit;

providing the second test parameters to the test system; and in the test system, applying the second test parameters to a fabricated embodiment of the integrated circuit.

12. The method of claim 11 wherein the integrated circuit is a programmable logic device.

13. In a test system, a method of testing an integrated circuit comprising:

receiving a test process for the integrated circuit;

determining if the test process is to be applied to a simulated version of the integrated circuit or to a fabricated version of the integrated circuit;

applying the test process to the simulated version of the integrated circuit if it is determined that the test process is to be applied to the simulated version of the integrated circuit; and applying the test process to the fabricated version of the integrated circuit if it is determined that the test process is to be applied to the fabricated version of the integrated circuit.

14. The method of claim 13 wherein applying the test process to the simulated version of the integrated circuit comprises converting the test process from a first format to a second format suitable for applying to the simulated version of the integrated circuit.

15. The method of claim 13 wherein applying the test process to the simulated version of the integrated circuit comprises receiving response data generated by applying the test process to the simulated version of the integrated circuit.

16. The method of claim 13 wherein applying the test process to the fabricated version of the integrated circuit comprises receiving response data generated from applying the test process to the fabricated version of the integrated circuit.

17. The method of claim 13 wherein the integrated circuit is a programmable logic device.

18. The method of claim 13 wherein the integrated circuit is an analog circuit.

19. An apparatus for testing integrated circuits comprising:

a test system, the test system configured to:

receive a first test process;

apply the first test process to a simulated version of an integrated circuit before fabrication of the integrated circuit;

receive response data generated from applying the first test process to the simulated version of the integrated circuit;

receive a second test process, wherein the second test process is generated by modifying the first test process based on the response data generated from applying the first test process to the simulated version of the integrated circuit; and apply the second test process to a fabricated version of the integrated circuit.

20. The apparatus of claim 19 wherein the test system is further configured to receive design information for the integrated circuit and to simulate the integrated circuit based on design information for the integrated circuit.

21. The apparatus of claim 20 wherein the design information includes netlist information for the integrated circuit.

22. The apparatus of claim 19 wherein the test system is configured to receive responses generated from applying the second test process to the fabricated embodiment of the integrated circuit.

23. The apparatus of claim 19 wherein the integrated circuit is a programmable logic device.

24. The apparatus of claim 19 wherein the integrated circuit is an analog circuit.

25. An apparatus for testing integrated circuits comprising:

a test system configured to received a test process, and to apply the test process to a simulated version of an integrated circuit before fabrication of the integrated circuit, or to a fabricated version of the integrated circuit.

26. The apparatus of claim 25 wherein the test system is further configured to convert the test process from a first format to a second format suitable for applying to the simulated version of the integrated circuit.

27. The apparatus of claim 25 wherein the integrated circuit is a programmable logic device.

28. An apparatus comprising:

a test system for testing integrated circuits comprising a hardware interface and a software interface;

a DUT interface coupled to the hardware interface and configured to receive a fabricated version of an integrated circuit; and a simulator coupled to the software interface, the simulator configured to simulate the integrated circuit, wherein the test system is configured to apply a first test process to a simulated version of the integrated circuit via the software interface before fabrication of the integrated circuit, and to apply a second test process to the fabricated version of the integrated circuit via the hardware interface, the second test process being generated from the first test process.

29. In a test system, a computer program product for testing integrated circuits comprising:

code for receiving first test parameters for an integrated circuit;

code for applying the first test parameters to a simulated version of the integrated circuit before fabrication of the integrated circuit;

code for receiving response data generated from applying the first test parameters to the simulated version of the integrated circuit;

code for receiving second test parameters, wherein the second test parameters are generated by modifying the first test parameters based on the response data generated from applying the first test parameters to the integrated circuit;

code for applying the second test parameters to a fabricated version of the integrated circuit; and a computer-readable medium for storing the codes.

30. In a test system, a computer program product for testing integrated circuits comprising:

code for receiving a test process for an integrated circuit;

code for determining if the test process is to be applied to a simulated version of the integrated circuit or to a fabricated version of the integrated circuit;

code for applying the test process to the simulated version of the integrated circuit if it is determined that the test process is to be applied to the simulated version of the integrated circuit;

code for applying the test process to the fabricated version of the integrated circuit if it is determined that the test process is to be applied to the fabricated version of the integrated circuit; and a computer-readable medium for storing the codes.

31. The computer program product of claim 30 wherein the code for applying the test process to the simulated version of the integrated circuit comprises code for converting the test process from a first format to a second format suitable for applying to the simulated version of the integrated circuit.

32. The computer program product of claim 30 wherein the integrated circuit is a programmable logic device.

33. An apparatus comprising:

a test system for testing integrated circuits comprising a hardware interface and a software interface;

a DUT interface coupled to the hardware interface and configured to receive a fabricated version of an integrated circuit; and a simulator coupled to the software interface, the simulator configured to simulate the integrated circuit, wherein the test system is configured to;

receive a test process;

apply the test process to a simulated version of the integrated circuit via the software interface before fabrication of the integrated circuit; and apply the test process to a fabricated version of the integrated circuit via the hardware interface.

34. A test system comprising:

a memory configured to a store a plurality of code modules for execution by the test system, the plurality of code modules comprising:

a code module for receiving a test process for an integrated circuit; and a code module for testing the integrated circuit, wherein the code module is configurable to operate in a first state or a second state; and a hardware interface to hold a fabricated version of the integrated circuit, wherein in the first state, the code module for testing the integrated circuit configures the test system to apply the test process to a simulated version of the integrated circuit before fabrication of the integrated circuit, wherein in the second state, the code module for testing the integrated circuit configures the test system to apply the test process to the fabricated version of the integrated circuit using the hardware interface.

35. The test system of claim 34 wherein in the first state, the test process is provided to a simulator over a network, and the code for testing the integrated circuit packages the test process with network header information to direct the test process from the test system to the simulator.

36. The test system of claim 34 wherein in the first state, the test system is configured to receive output data in response to applying the test process to the simulated version of the integrated circuit.

* * * * *